(12) United States Patent
Kim

(10) Patent No.: US 10,056,257 B2
(45) Date of Patent: Aug. 21, 2018

(54) METHODS FOR FORMING FINE PATTERNS USING SPACERS

(71) Applicant: SK hynix Inc., Gyeonggi-do (KR)

(72) Inventor: Hyun Seong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/630,686

(22) Filed: Jun. 22, 2017

(65) Prior Publication Data

US 2018/0138041 A1    May 17, 2018

(30) Foreign Application Priority Data

Nov. 14, 2016 (KR) .................. 10-2016-0151201

(51) Int. Cl.
| | |
|---|---|
| *H01L 21/033* | (2006.01) |
| *H01L 21/3213* | (2006.01) |
| *H01L 21/311* | (2006.01) |
| *H01L 21/027* | (2006.01) |

(52) U.S. Cl.
CPC ...... *H01L 21/0338* (2013.01); *H01L 21/0273* (2013.01); *H01L 21/0337* (2013.01); *H01L 21/31111* (2013.01); *H01L 21/31144* (2013.01); *H01L 21/32133* (2013.01); *H01L 21/32139* (2013.01)

(58) Field of Classification Search
None
See application file for complete search history.

(56) References Cited

U.S. PATENT DOCUMENTS

2014/0264516 A1* 9/2014 Seo .................. H01L 43/12
257/295

FOREIGN PATENT DOCUMENTS

KR    1020150129242    11/2015

* cited by examiner

*Primary Examiner* — Joseph Schoenholtz
(74) *Attorney, Agent, or Firm* — IP & T Group LLP

(57) ABSTRACT

There is provided a method for forming fine patterns. The method includes forming a pattern divider on an underlying layer, forming a mask layer on the underlying layer to cover the pattern divider, forming an opening pattern that vertically penetrates the mask layer to expose a portion of the pattern divider and intersects the exposed portion of the pattern divider, and selectively removing portions of the underlying layer exposed by the opening pattern of the mask layer to form a couple of opening sub-patterns.

16 Claims, 13 Drawing Sheets

METHODS FOR FORMING FINE PATTERNS USING SPACERS

CROSS-REFERENCE TO RELATED APPLICATIONS

The present application claims priority under 35 U.S.C 119(a) to Korean Application No. 10-2016-0151201, filed on Nov. 14, 2016, which is herein incorporated by reference in its entirety.

BACKGROUND

1. Technical Field

Various embodiments of the present disclosure relate to semiconductor technologies and, more particularly, to methods for forming fine patterns using spacers.

2. Related Art

With rapid growth in the semiconductor industry, a lot of effort has been focused on integrating more patterns in a limited area of a semiconductor substrate. That is, attempts to increase the integration density of semiconductor devices have typically resulted in formation of fine patterns having a nano-scale critical dimension (CD). For example, each of highly integrated semiconductor memory devices such as dynamic random access memory (DRAM) devices may include a cell array region in which fine patterns are regularly arrayed as well as a peripheral region in which fine patterns are randomly arrayed.

In the event that the fine patterns are formed using only a photolithography process, there may be some limitations in forming the fine patterns due to image resolution limits of photolithography apparatuses used in the photolithography process. Thus, advanced patterning technologies have been proposed to form the fine patterns. For example, a double patterning technology (DPT) or a spacer patterning technology (SPT) has been proposed to overcome the resolution limits of the lithography apparatuses and to realize the fine patterns.

SUMMARY

According to an embodiment, there is provided a method for forming fine patterns. The method includes forming a sacrificial pattern on an underlying layer, forming a spacer on a sidewall of the sacrificial pattern, removing the sacrificial pattern, forming a mask layer on the underlying layer to cover the spacer, forming an opening is pattern that vertically penetrates the mask layer to expose a portion of the spacer and intersects the exposed portion of the spacer, and removing portions of the underlying layer exposed in the opening pattern of the mask layer and the spacer to form a couple of opening sub-patterns.

According to another embodiment, there is provided a method for forming fine patterns. The method includes forming a sacrificial pattern on an underlying layer, forming a closed loop-shaped spacer surrounding a sidewall of the sacrificial pattern, removing the sacrificial pattern, forming a mask layer on the underlying layer to cover the spacer, and forming a first opening pattern and a second opening pattern that vertically penetrate the mask layer to respectively expose a first portion and a second portion of the spacer. The first opening pattern and the second opening pattern intersect the exposed first and second portions of the spacer, respectively. Portions of the underlying layer exposed by the first and second opening patterns of the mask layer are selectively removed to form a couple of first opening sub-patterns separated from each other by the first portion of the spacer and a couple of second opening sub-patterns separated from each other by the second portion of the spacer. A distance between the couple of first opening sub-patterns is substantially equal to a distance between the couple of second opening sub-patterns.

According to yet another embodiment, there is provided a method for forming fine patterns. The method includes forming a pattern divider on an underlying layer, forming a mask layer on the underlying layer to cover the pattern divider, forming an opening pattern that vertically penetrates the mask layer to expose a portion of the pattern divider and intersects the exposed portion of the pattern divider, and selectively removing portions of the underlying layer exposed by the opening pattern of the mask layer to form a couple of opening sub-patterns.

BRIEF DESCRIPTION OF THE DRAWINGS

Various embodiments of the present disclosure v ill become more apparent in view of the attached drawings and accompanying detailed description, in which.

DETAILED DESCRIPTION OF THE EMBODIMENTS

Figure 1:
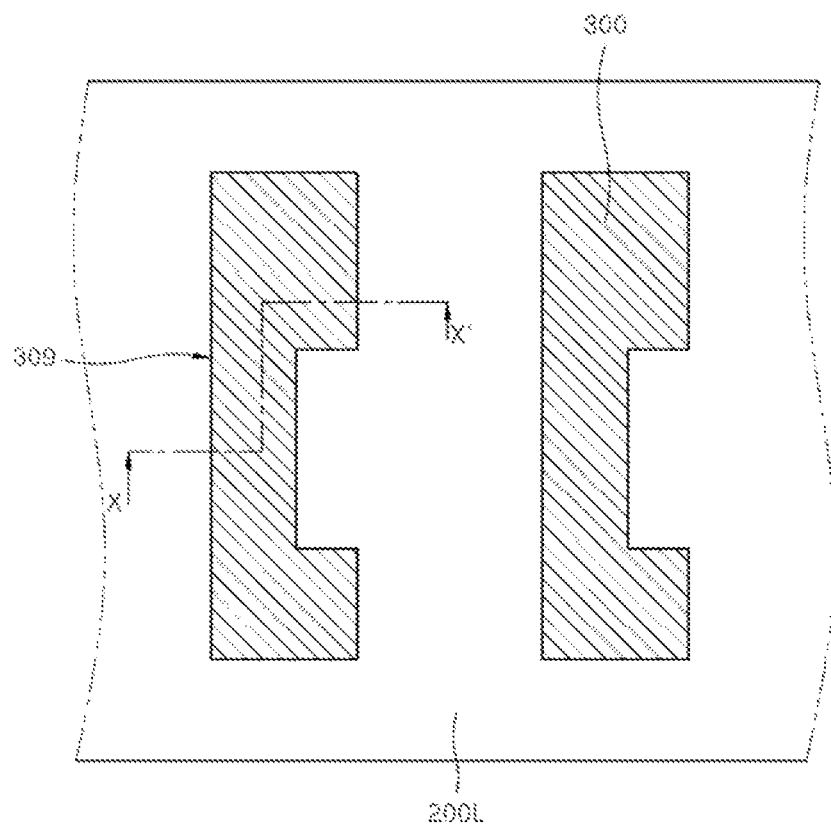
FIGS. 1 to 13 illustrate a method of forming fine patterns according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

It will be understood that although the terms first, second, third, top, bottom, upper, lower etc. may be used herein to describe various elements, these elements should not be limited by these terms. These terms are only used to distinguish one element from another element, but not used to define only the element itself or to mean a particular sequence. Thus, a first element in some embodiments could be termed a second element in other embodiments without departing from the teachings of the inventive concept.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion for example, "between" versus "directly between" or "adjacent" versus "directly adjacent".

The following embodiments may be applied to realization of memory devices such as dynamic random access memory (DRAM) devices, phase change random access memory (PcRAM) devices or resistive random access memory (ReRAM) devices, static random access memory (SRAM) devices, flash memory devices, magnetic random access memory (MRAM) devices or ferroelectric random access memory (FeRAM) devices. Furthermore, the following embodiments may be applied to realization of logic devices in which logic circuits are integrated. Moreover, the following embodiments may be applied to other semiconductor devices including fine patterns.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
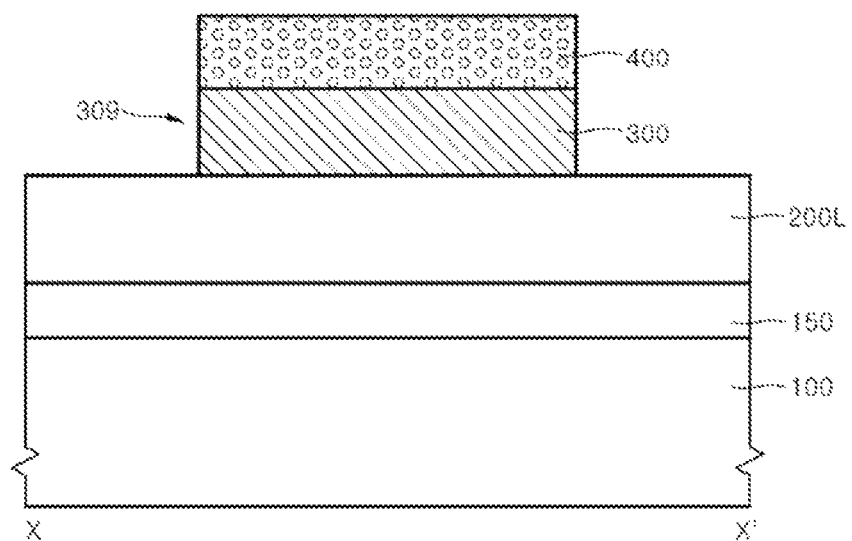

FIG. 1 is a plan view illustrating sacrificial patterns 300, and FIG. 2 is a cross-sectional view taken along a line X-X' of FIG. 1.

Referring to FIGS. 1 and 2, the sacrificial patterns 300 may be formed on an underlying layer 200L. The underlying layer 200L may be formed on a substrate 100 and may be patterned to form fine patterns in a subsequent process. The substrate 100 may be a semiconductor substrate on which integrated circuits are integrated. In some embodiments, the substrate 100 may be one of various substrates including a glass substrate, a dielectric substrate, an insulation substrate and a metal substrate. In the present embodiment, the substrate 100 may be a silicon substrate on which memory circuits or logic circuits are integrated.

An intermediate layer 150 may be additionally formed between the substrate 100 and the underlying layer 200L. The intermediate layer 150 may be formed to include at least one of various material layers including a dielectric layer, an insulation layer, a semiconductor layer and a conductive layer. For example, the intermediate layer 150 may be formed to include a polysilicon layer.

The underlying layer 200L may be disposed under the sacrificial patterns 300 and may be formed of a material having an etch selectivity with respect to the sacrificial patterns 300. The underlying layer 200L may be formed to include at least one of various material layers including a dielectric layer, an insulation layer and a conductive layer. The underlying layer 200L may be formed of an appropriate material in consideration of a material of the sacrificial patterns 300. For example, the underlying layer 200L may be formed to include a silicon nitride layer.

A layer for forming the sacrificial patterns 300 may be deposited on the underlying layer 200L. The layer for forming the sacrificial patterns 300 may be formed to include one of various material layers having an etch selectivity with respect to the underlying layer 200L. The layer for forming the sacrificial patterns 300 may be formed to include a dielectric layer, an insulation layer or a conductive layer. The layer for forming the sacrificial patterns 300 may be formed of an appropriate material in consideration of a material of the underlying layer 200L. For example, if the underlying layer 200L is formed to include a silicon nitride layer, the layer for forming the sacrificial patterns 300 may be formed to include an amorphous carbon layer. In the event that the layer for forming the sacrificial patterns 300 is formed to include an amorphous carbon layer, a capping layer (not shown) may be additionally formed on the amorphous carbon layer. The capping layer may be formed to include a dielectric layer such as a silicon oxynitride (SiON) layer.

A first photoresist layer may be formed on the layer for forming the sacrificial patterns 300, and a first photolithography process using a first photo mask (not shown) may be applied to the first photoresist layer to form first mask patterns 400. The first mask patterns 400 may be formed by applying an exposure step and a development step to the first photoresist layer. The layer for forming the sacrificial patterns 300 may be etched and patterned using the first mask patterns 400 as etch masks to form the sacrificial patterns 300. That is, an exposed portion of the layer for forming the sacrificial patterns 300 by the first mask patterns 400 may be selectively removed to form the sacrificial patterns 300. Thus, the sacrificial patterns 300 may be formed to have substantially the same pattern feature as the first mask patterns 400 in a plan view.

Each of the sacrificial patterns 300 may be designed to have a relatively large size or a relatively large width. Each of the sacrificial patterns 300 may have a tetragonal shape or a rectangular shape when viewed from a plan view. However, in some embodiments, at least one of the sacrificial patterns 300 may have a polygonal shape when viewed from a plan view. Positions of sidewalls 309 of the sacrificial patterns 300 may have relation to positions of final patterns which are formed in a subsequent process. For example, portions of the sidewalls 309 of the sacrificial patterns 300 may be located to contact the final patterns which are formed in a subsequent process. Thus, a planar feature of the sacrificial patterns 300 may be designed to have a polygonal shape in consideration of a position of the final patterns which are formed in a subsequent process. A relationship between a position of the side 309 of the sacrificial patterns 300 and a position of the final patterns formed in a subsequent process will be described more fully later.

Since the sacrificial patterns 300 are designed to have a relatively large size or a relatively large width, the first photolithography process for forming the first mask patterns 400 may be performed using an exposure apparatus having a relatively low resolution limit. That is, it may be possible to perform the first photolithography process for forming the first mask patterns 400 using an exposure apparatus having a relatively low resolution limit even without using an exposure apparatus having a relatively high resolution limit, for example, an immersion argon fluoride (ArF) exposure apparatus. Accordingly, the first photolithography process for forming the first mask patterns 400 may be performed using a dry ArF exposure apparatus or a krypton fluoride (KrF) exposure apparatus having a resolution limit which is lower than a resolution limit of the immersion ArF exposure apparatus.

After the sacrificial patterns 300 are formed, the first mask patterns 400 may be selectively removed.

Figure 3:
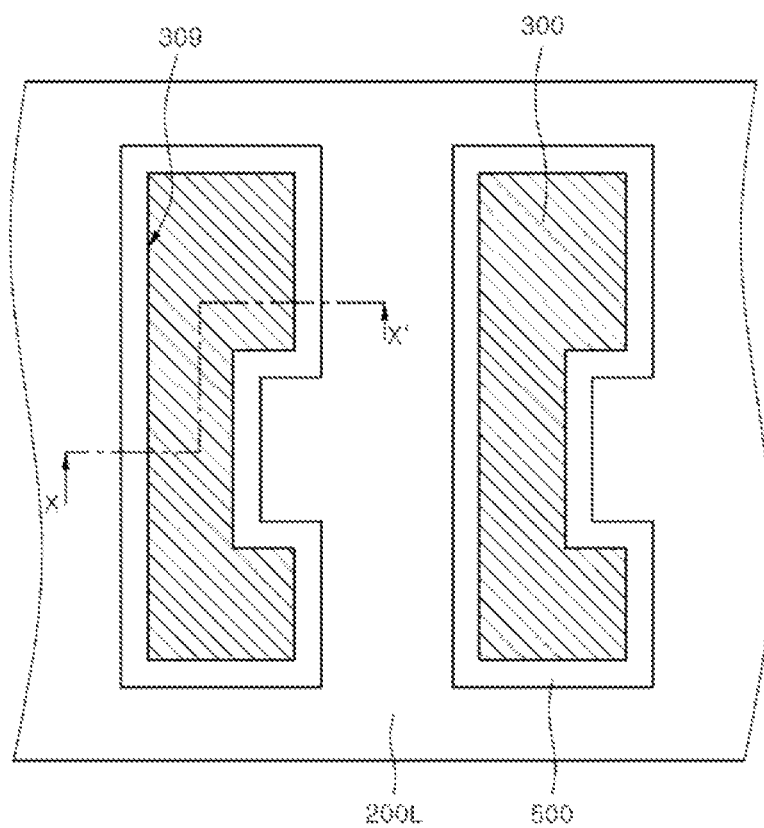
Figure 4:
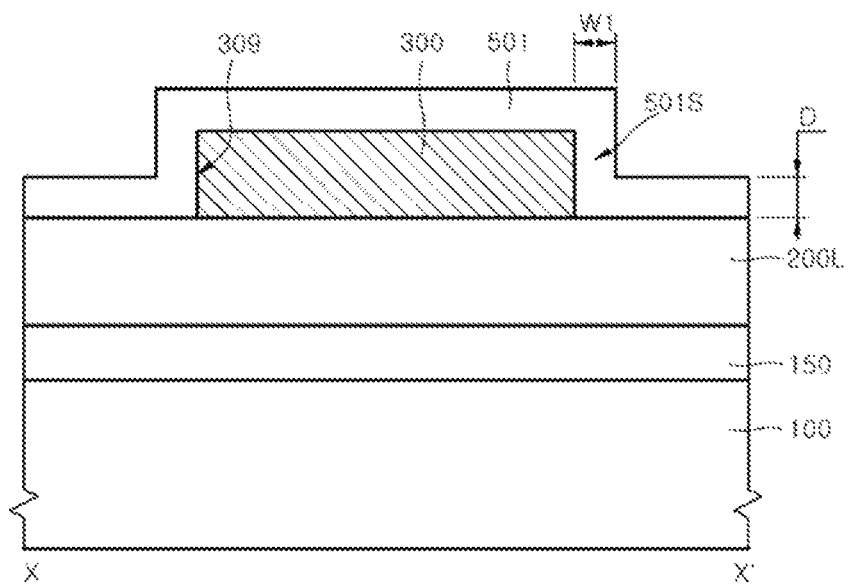
Figure 5:
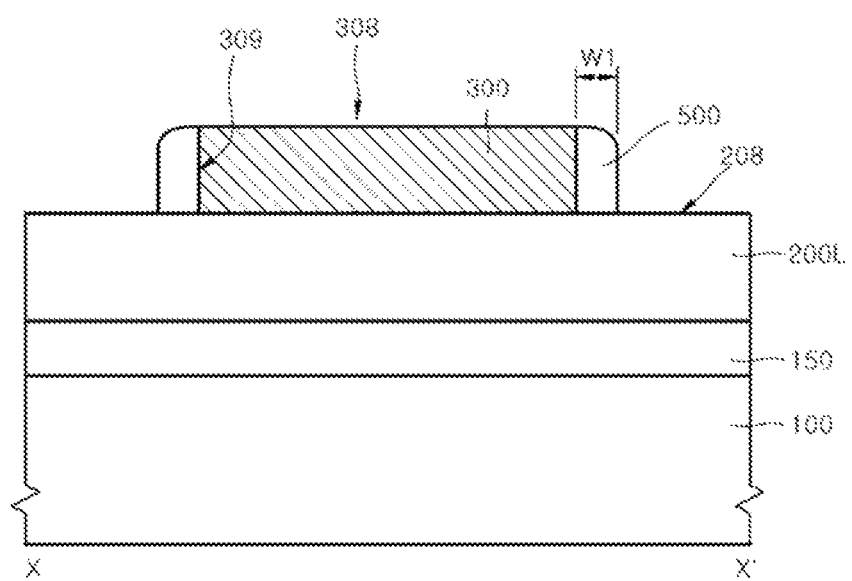

FIG. 3 is a plan view illustrating a step of forming spacers 500, and FIGS. 4 and 5 are cross-sectional views taken along a line X-X' of FIG. 3.

Referring to FIGS. 3 and 5, the spacers 500 may be formed on the sidewalls 309 of the sacrificial patterns 300. As illustrated in FIG. 4, a spacer layer 501 may be formed on the underlying layer 200L to cover top surfaces and the sidewalls 309 of the sacrificial patterns 300. The spacer layer 501 may be deposited to have a uniform thickness D. A first width W1 of portions 501S of the spacer layer 501 covering the sidewalls 309 of the sacrificial patterns 300 may be determined according to the thickness D of the spacer layer 501. The first width W1 of the portions 501S of the spacer layer 501 may increase if the thickness D of the spacer layer 501 increases, and the first width W1 of the portions 501S of the spacer layer 501 may be reduced if the thickness D of the spacer layer 501 is reduced. That is, the first width W1 of the portions 501S of the spacer layer 501 may be controlled by varying the thickness D of the spacer layer 501.

After the spacer layer 501 is deposited to cover the sacrificial patterns 300, the spacer layer 501 may be etched back or anisotropically etched to form the spacers 500. That is, if the spacer layer 501 is etched back or anisotropically etched until top surfaces of the sacrificial patterns 300 and a top surface of the underlying layer 200L are exposed, the portions 501S of the spacer layer 501 covering the sidewalls 309 of the sacrificial patterns 300 may remain to provide the spacers 500. Each of the spacers 500 may be formed to have a closed loop shape surrounding any one of the sacrificial patterns 300 in a plan view.

The spacers 500 may have a width which is equal to the first width W1 of the portions 501S of the spacer layer 501. Thus, the width that is, the first width W1 of the spacers 500 may be controlled by varying the thickness D of the spacer layer 501. The thickness D of the spacer layer 501 may be controlled to be less than a few nanometers. Thus, the width W1 of the spacers 500 may also be controlled to be less than a few nanometers. That is, the width W1 of the spacers 500 may be controlled to be within the range of about a few nanometers to about several tens of nanometers or to be less than a few nanometers.

The spacers 500 may be formed of a material having an etch selectivity with respect to at least the sacrificial patterns 300. The spacers 500 may be formed to include a material exhibiting a relatively high etch rate as compared with the sacrificial patterns 300 so that the sacrificial patterns 300 remains even after the spacer layer 501 is over-etched to form the spacers 500. The spacers 500 may be formed to include one of various materials, for example, a dielectric material, an insulation material or a conductive material. A material of the spacers 500 may be selected in consideration of a material of the sacrificial patterns 300. For example, the spacers 500 may be formed to include a silicon oxide ($SiO_2$) material. In some other embodiments, the spacers 500 may be formed to include a polysilicon material.

Figure 6:
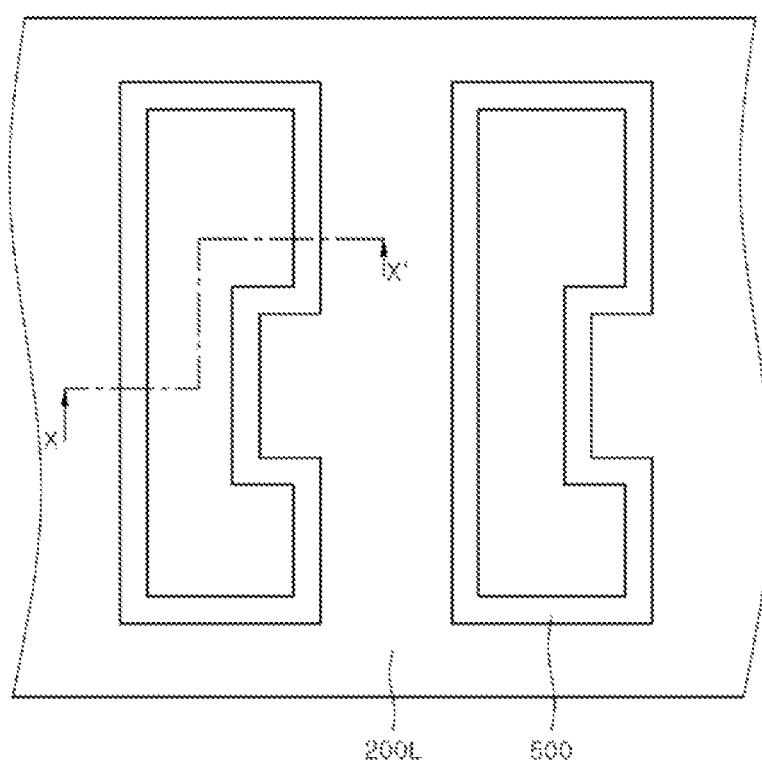
Figure 7:
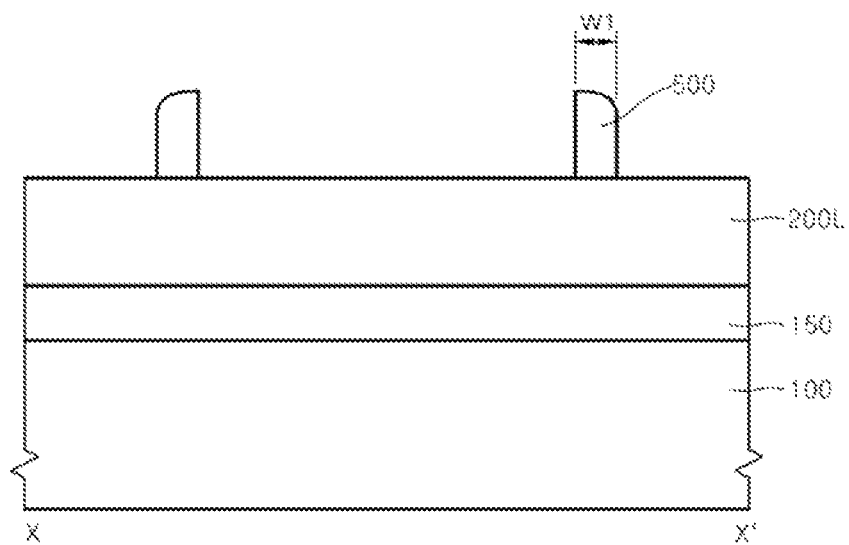

FIG. 6 is a plan view illustrating a layout of the spacers 500, and FIG. 7 is a cross-sectional view taken along a line X-X' of FIG. 6.

Referring to FIGS. 6 and 7, the sacrificial patterns 300 may be selectively removed to leave the spacers 500. For example, if the sacrificial patterns 300 are formed to include a carbon layer, the sacrificial patterns 300 may be removed using an ashing process that employs oxygen plasma as a reactive gas. After the sacrificial patterns 300 are removed, portions of the underlying layer 200L under the sacrificial patterns 300 may be exposed and the spacers 500 may remain on the underlying layer 200L. Each of the spacers 500 may remain to have a closed loop shape.

Figure 8:
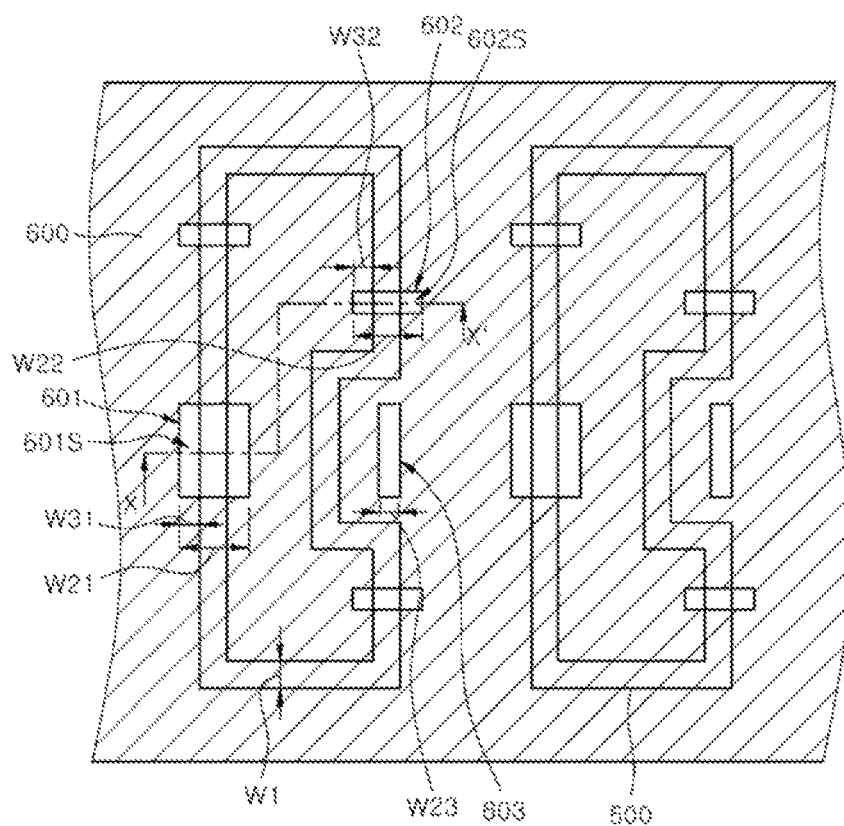
Figure 9:
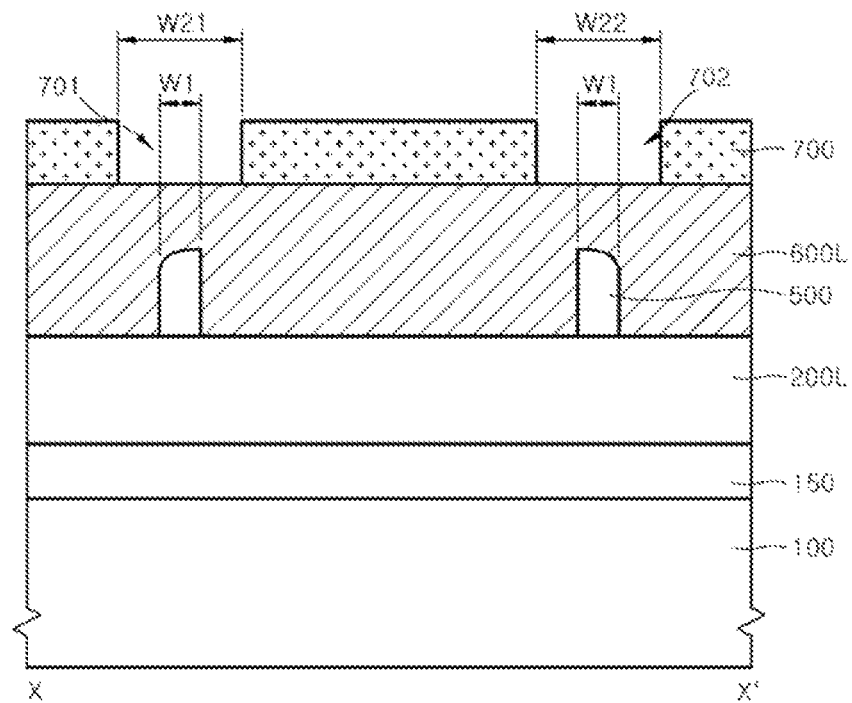
Figure 10:
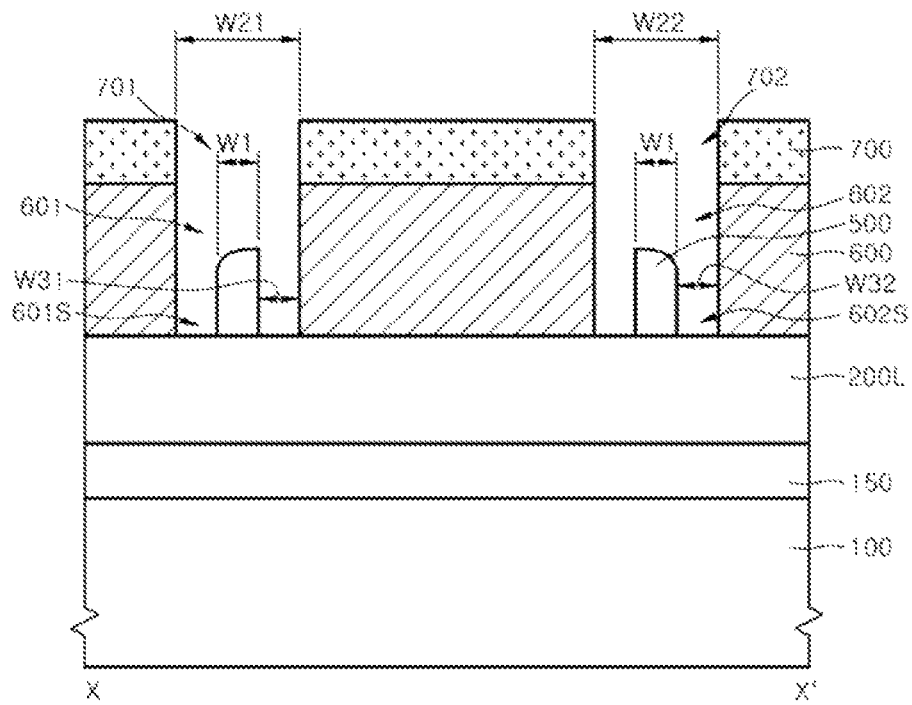

FIG. 8 is a plan view illustrating a second mask pattern 600 providing first opening patterns 601 and second opening patterns 602, and FIGS. 9 and 10 are cross-sectional views taken along a line X-X' of FIG. 8.

Referring to FIGS. 8 and 9, a second mask layer 600L may be formed on the underlying layer 200L to cover the spacers 500. The second mask layer 600L may be formed of a material that is different from at least the spacers 500 and the underlying layer 200L. The second mask layer 600L may be formed of a material having an etch selectivity with respect to at least the spacers 500 and the underlying layer 200L. The second mask layer 600L may be formed to include one of various materials, for example, a dielectric material, an insulation material or a conductive material. A material of the second mask layer 600L may be selected in consideration of materials of the spacers 500 and the underlying layer 200L. For example, the second mask layer 600L may be formed to include a spin-on-carbon (SOC) layer. If the second mask layer 600L is formed to include an SOC layer, a silicon oxynitride layer (not shown) may be additionally formed on the second mask layer 600L to act as a capping layer. The second mask layer 600L may be formed to have a thickness which is greater than a height of the spacers 500 in order to fully cover the spacers 500.

After a second photoresist layer (not shown) is formed on the second mask layer 600L, the second photoresist layer may be patterned using a second photolithography process with a second photo mask to form a third mask pattern 700. That is, the third mask pattern 700 may be formed by applying an exposure step and a development step to the second photoresist layer. The third mask pattern 700 may be formed to provide opening patterns such as third opening patterns 701 and fourth opening patterns 702. The opening patterns 701 and 702 may correspond to opening features or opening holes that expose portions of the second mask layer 600L. The third opening patterns 701 may be formed to have a second width W21, and the fourth opening patterns 702 may be formed to have a third width W22. The second width W21 may be different from the third width W22.

Each of the third and fourth opening patterns 701 and 702 may be located to overlap with a portion of any one of the spacers 500. Each of the third and fourth opening patterns 701 and 702 may be formed to cross or intersect a portion of any one of the spacers 500 when viewed from a plan view. Each of the third opening patterns 701 may have a feature which is different from a feature of each of the fourth opening patterns 702, in a plan view. Each of the spacers 500 may intersect central portions of the third and fourth opening patterns 701 and 702 and may extend to have a closed loop shape, in a plan view. Thus, the second width W21 of the third opening patterns 701 and the third width W22 of the fourth opening patterns 702 may be greater than the first width of the spacers 500.

Since the second width W21 of the third opening patterns 701 and the third width W22 of the fourth opening patterns 702 are less than a width of the first mask patterns 400, the second photolithography process used to form the third mask pattern 700 may be performed using an exposure apparatus having a relatively high resolution limit. For example, the second photolithography process may be performed using an immersion ArF exposure apparatus. That is, the second photolithography process may be performed using an exposure apparatus having a resolution limit which is higher than a resolution limit of an exposure apparatus used in the first photolithography process for forming the first mask patterns 400. Since an immersion ArF exposure apparatus has an improved resolution limit as compared with a dry ArF exposure apparatus and a krypton fluoride (KrF) exposure apparatus, the immersion ArF exposure apparatus may be used in the second photolithography process. Although at least two photolithography processes are used in a method for forming fine patterns according to the present disclosure, at least one of the photolithography processes may be performed using an exposure apparatus having a relatively low resolution limit.

Referring to FIGS. 8 and 10, the second mask layer 600L may be etched using the third mask pattern 700 as an etch mask. That is, portions of the second mask layer 600L exposed by the third and fourth opening patterns 701 and 702 of the third mask pattern 700 may be selectively removed to form a second mask pattern 600 exposing portions of the spacers 500. As a result, the second mask pattern 600 may be formed to provide first opening patterns 601 located under the third opening patterns 701 and second opening patterns 602 located under the fourth opening patterns 702.

The first opening patterns 601 may be formed to have substantially the same pattern features as the third opening patterns 701. The first opening patterns 601 may be formed to be aligned with the third opening patterns 701. Thus, the first opening patterns 601 may be formed to have substantially the same width as the second width W21. The second opening patterns 602 may be formed to have substantially the same pattern features as the fourth opening patterns 702. The second opening patterns 602 may be formed to be aligned with the fourth opening patterns 702. Thus, the second opening patterns 602 may be formed to have substantially the same width as the third width W22. Accordingly, as illustrated in FIG. 8, each of the first opening patterns 601 may be formed to expose and cross a portion of the spacer 500, in a plan view. Similarly, each of the second opening patterns 602 may be formed to expose and cross another portion of the spacer 500, in a plan view.

Each of the first opening patterns 601 may be divided into a couple of first opening sub-patterns 601S which are respectively located at both sides of the spacer 500 exposed by the first opening pattern 601. The couple of first opening sub-patterns 601S may be self-aligned with and separated from each other by the spacer 500 which is exposed by the first opening pattern 601. The couple of first opening sub-patterns 601S may be defined to be respectively located at both sides of a portion of the spacer 500. Since the spacers 500 are formed of a material having an etch rate which is lower than an etch rate of the second mask pattern 600, the spacers 500 may also act as etch masks while the second mask layer 600L is etched to form the first and second opening patterns 601 and 602. Each of the spacers 500 may act as a pattern divider that separates the first opening pattern 601 into the couple of first opening sub-patterns 601S.

Each of the couple of first opening sub-patterns 601S separated from each other by the spacer 500 may be formed to correspond to an opening hole having a fourth width W31 which is less than the second width W21 of the first opening patterns 601. The couple of first opening sub-patterns 601S may be disposed at both sides of a portion of the spacer 500, respectively. Since the couple of first opening sub-patterns 601S are separated from each other by the spacer 500, no spatial bridge may exist between the couple of first opening sub-patterns 601S even though the first width W1 of the spacer 500 is reduced.

If the couple of first opening sub-patterns 601S are directly defined by a photolithography process without using the spacer 500, the couple of first opening sub-patterns 601S adjacent to each other may be spatially connected to each other by an optical proximity effect to cause pattern failures. In addition, if the couple of first opening sub-patterns 601S are directly formed by an etch process without using the spacer 500, a material between the couple of first opening sub-patterns 601S may be easily and partially etched by a loading effect. As a result, the couple of first opening sub-patterns 601S adjacent to each other may be spatially connected to each other. In contrast, as illustrated in FIG. 10, in the event that the couple of first opening sub-patterns 601S are formed to be separated from each other by the spacer 500 and to be self-aligned with the spacer 500, the spacer 500 may act as a pattern divider or an etch barrier to provide the couple of first opening sub-patterns 601S which are clearly separated from each other. Accordingly, even though the couple of first opening sub-patterns 601S are designed to be adjacent to each other, no spatial bridge may be formed between the couple of first opening sub-patterns 601S.

Each of the second opening patterns 602 may also be divided into a couple of second opening sub-patterns 602S which are respectively located at both sides of the spacer 500 exposed by the second opening pattern 602. The couple of second opening sub-patterns 602S may be self-aligned with and separated from each other by the spacer 500 which is exposed by the second opening pattern 602. Each of the couple of first opening sub-patterns 602S separated from each other by the spacer 500 may be formed to correspond to an opening hole having a fifth width W32 which is less than the third width W22 of the second opening patterns 602. The couple of second opening sub-patterns 602S may be disposed at both sides of another portion of the spacer 500, respectively. Since the couple of second opening sub-patterns 602S are separated from each other by the spacer 500, no spatial bridge may exist between the couple of second opening sub-patterns 602S even though the first width W1 of the spacer 500 is reduced.

Furthermore, although sixth opening patterns 603 of FIG. 8 are not illustrated in FIGS. 9 and 10, the third mask pattern 700 may additionally provide fifth opening patterns (not shown) for forming the sixth opening patterns 603. During the etch process for forming the first and second opening patterns 601 and 602, features of the fifth opening patterns in the third mask pattern 700 may be transferred to the second mask layer 600L to form the sixth opening patterns 603. The sixth opening patterns 603 may be formed to correspond to opening holes having a sixth width W23 which is approximately or substantially equal to the fourth width W31 or the fifth width W32. Each of the sixth opening patterns 603 may be designed to be isolated from other opening patterns. Thus, while the second photolithography process and the etch process are performed to form the fifth opening patterns and the sixth opening patterns 603, a proximity effect and a loading effect may be suppressed. Accordingly, the sixth opening patterns 603 may be formed to have the sixth width W23 which is substantially equal to the fourth width W31 or the fifth width W32.

Figure 11:
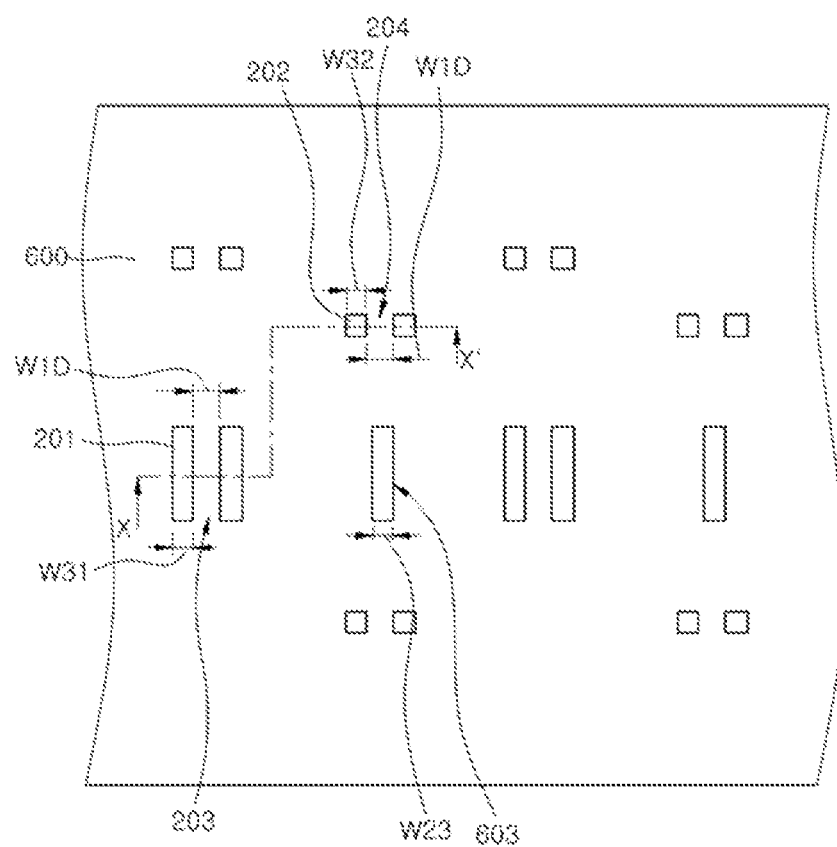
Figure 12:
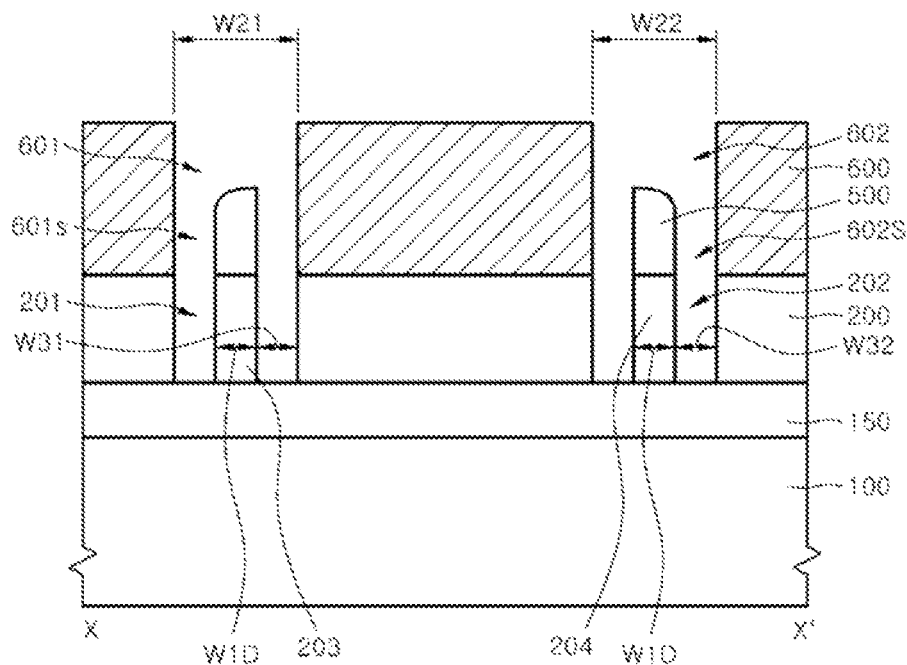
Figure 13:
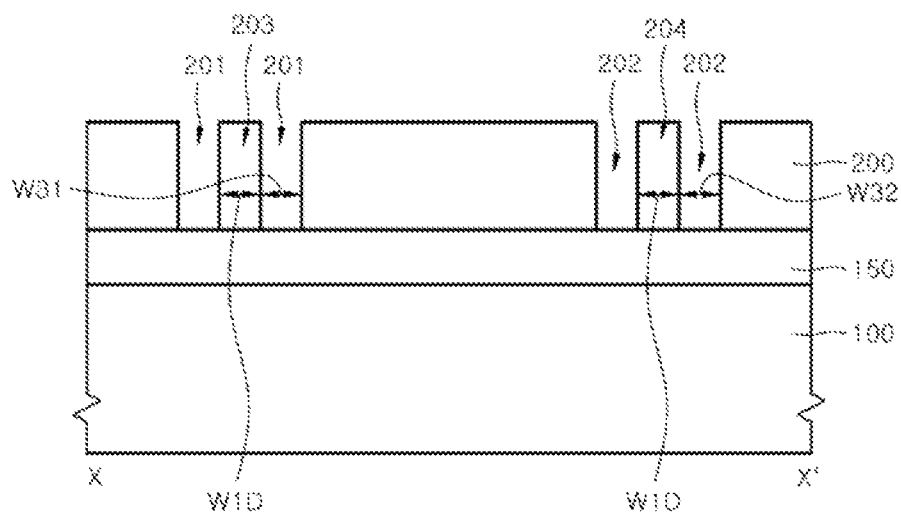

FIG. 11 is a plan view illustrating a layout of seventh opening sub-patterns 201 and eighth opening sub-patterns 202, and FIGS. 12 and 13 are cross-sectional views taken along a line X-X' of FIG. 11.

Referring to FIGS. 11 and 12, the underlying layer 200L may be anisotropically etched using the spacers 500, which are exposed by the first and second opening patterns 601 and 602, and the second mask pattern 600 as etch masks. As a result, the seventh opening sub-patterns 201 vertically extending from the first opening sub-patterns 601S and the eighth opening sub-patterns 202 vertically extending from the second opening sub-patterns 602S may be formed in the underlying layer 200L. That is, the underlying layer 200L may be patterned to provide an underlying layer pattern 200 through which the seventh and eighth opening sub-patterns 201 and 202 vertically pass. The third mask pattern 700 may be removed before or during the etch process for forming the seventh and eighth opening sub-patterns 201 and 202.

Since the seventh opening sub-patterns 201 are formed to vertically extend from the first opening sub-patterns 601S, the seventh opening sub-patterns 201 may correspond to through holes having the fourth width W31 of the first opening sub-patterns 601S. A first pattern divider 203 of the underlying layer pattern 200, which is disposed between a couple of the adjacent seventh opening sub-patterns 201, may be formed to overlap with a portion of the spacer 500. Thus, the first pattern divider 203 of the underlying layer pattern 200 may have a seventh width MD which is substantially equal to the first width W1 of the spacer 500. The first pattern divider 203 of the underlying layer pattern 200 may be formed to physically isolate a couple of the adjacent seventh opening sub-patterns 201 from each other. Thus, a couple of the adjacent seventh opening sub-patterns 201 may be disposed at both sides of the first pattern divider 203, respectively.

Since the eighth opening sub-patterns 202 are formed to vertically extend from the second opening sub-patterns 602S, the eighth opening sub-patterns 202 may correspond to through holes having the fifth width W32 of the second opening sub-patterns 602S A second pattern divider 204 of the underlying layer pattern 200, which is disposed between a couple of the adjacent eighth opening sub-patterns 202, may be formed to overlap with another portion of the spacer 500. Thus, the second pattern divider 204 of the underlying layer pattern 200 may have the seventh width W1D which is substantially equal to the first width W1 of the spacer 500. The second pattern divider 204 of the underlying layer pattern 200 may be formed to physically isolate a couple of the adjacent eighth opening sub-patterns 202 from each other.

Since all of the first and second pattern dividers 203 and 204 of the underlying layer pattern 200 are formed to be self-aligned with the spacers 500, the first and second pattern dividers 203 and 204 may have the seventh width W1D which is substantially equal to the first width W1 of the spacers 500. Accordingly, even though the fourth width W31 of the seventh opening sub-patterns 201 is different from the fifth width W32 of the eighth opening sub-patterns 202, a distance between a couple of the adjacent seventh opening sub-patterns 201 as well as a distance between a couple of the adjacent eighth opening sub-patterns 202 may be substantially equal to the seventh width W1D. That is, a couple of the adjacent seventh opening sub-patterns 201 may be separated from each other by the first width W1 of the spacers 500, and a couple of the adjacent eighth opening sub-patterns 202 may also be separated from each other by the first width W1 of the spacers 500.

Referring to FIGS. 11, 12 and 13, the second mask pattern 600 and the spacers 500 may be removed to expose a top surface of the underlying layer pattern 200. The underlying layer pattern 200 may include through holes corresponding to the seventh opening sub-patterns 201, two adjacent ones of which are separated from each other by the seventh width W1D, and the eighth opening sub-patterns 202, two adjacent ones of which are separated from each other by the seventh width W1D. The underlying layer pattern 200 may be used as an etch mask or a hard mask while the intermediate layer 150 is patterned in a subsequent process. Alternatively, the underlying layer pattern 200 may be used as an interlayer insulation layer that physically separates and electrically insulates conductive vias or conductive contact plugs, which are formed to fill the seventh and eighth opening sub-patterns 201 and 202 in a subsequent process, from each other.

According to the embodiments described above, nano-scale structures or nano structures can be fabricated on a large-sized substrate. The nano structures may be used in fabrication of polarizing plates or in formation of a reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, molding processes for fabricating electronic/electric components such as nano-scaled interconnections, a molding process for fabricating catalysts of solar cells and fuel cells, a molding process for fabricating etch masks and organic light emitting diodes (OLEDs) and a molding process for fabricating gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments of the present disclosure which have been disclosed are for illustrative purposes. Those skilled in the art will appreciate that various modifications, additions and substitutions are possible, without departing from the scope and spirit of the present disclosure and the accompanying claims.

What is claimed is:

1. A method for forming fine patterns, the method comprising:
    forming a sacrificial pattern on an underlying layer;
    forming a spacer on a sidewall of the sacrificial pattern;
    removing the sacrificial pattern;
    forming a mask layer on the underlying layer to cover the spacer;
    forming an opening pattern that vertically penetrates the mask layer to expose a portion of the spacer and intersects the exposed portion of the spacer; and
    removing portions of the underlying layer exposed in the opening pattern of the mask layer and the spacer to form a couple of opening sub-patterns,
    wherein the couple of opening sub-patterns are formed to correspond to through holes penetrating the underlying layer.

2. The method of claim 1, wherein the couple of opening sub-patterns are formed to align with the spacer and to be separated by the spacer, respectively.

3. The method of claim 1, wherein the couple of opening sub-patterns are formed to be spaced apart from each other by a width of the spacer.

4. The method of claim 1, wherein the sacrificial pattern is formed to include a material having an etch selectivity with respect to the underlying layer.

5. The method of claim 1, wherein the forming of the opening pattern includes:
    forming a resist pattern on the mask layer to expose a portion of the mask layer so that the exposed portion of the mask layer intersects the spacer in a plan view; and
    anisotropically and selectively etching the exposed portion of the mask layer to expose a portion of the spacer.

6. The method of claim 1, wherein the spacer acts as an etch mask while the opening pattern is formed.

7. A method for forming fine patterns, the method comprising:
    forming a sacrificial pattern on an underlying layer;
    forming a closed loop-shaped spacer surrounding a sidewall of the sacrificial pattern;
    removing the sacrificial pattern;
    forming a mask layer on the underlying layer to cover the spacer;
    forming a first opening pattern and a second opening pattern that vertically penetrate the mask layer to respectively expose a first portion and a second portion of the spacer, wherein the first opening pattern and the second opening pattern respectively intersect the exposed first and second portions of the spacer; and removing portions of the underlying layer exposed by the first and second opening patterns of the mask layer to form a couple of first opening sub-patterns separated from each other by the first portion of the spacer and a couple of second opening sub-patterns separated from each other by the second portion of the spacer, wherein a distance between the couple of first opening sub-patterns is substantially equal to a distance between the couple of second opening sub-patterns.

8. The method of claim 7, wherein a width of the first opening pattern is different from a width of the second opening pattern.

9. The method of claim 7, wherein a width of the first opening sub-patterns is different from a width of the second opening sub-patterns.

10. The method of claim 7, wherein the couple of first opening sub-patterns are formed to be located at both sides of the first portion of the spacer.

11. The method of claim 7, wherein the couple of first opening sub-patterns are formed to be separated from each other by a width of the spacer.

12. The method of claim 7, wherein the first and second opening sub-patterns are formed to correspond to through holes that substantially penetrate the underlying layer.

13. A method for forming fine patterns, the method comprising:

forming a pattern divider on an underlying layer;

forming a mask layer on the underlying layer to cover the pattern divider;

forming an opening pattern that vertically penetrates the mask layer to expose a portion of the pattern divider and intersects the exposed portion of the pattern divider; and removing portions of the underlying layer exposed by the opening pattern of the mask layer to form a couple of opening sub-patterns, wherein the couple of opening sub-patterns are formed to correspond to through holes penetrating the underlying layer.

14. The method of claim 13, wherein the forming of the pattern divider includes:

forming a sacrificial pattern on the underlying layer;

forming a spacer on a sidewall of the sacrificial pattern; and removing the sacrificial pattern.

15. The method of claim 13, wherein the couple of opening sub-patterns are formed to align with the pattern divider and to be separated by the pattern divider.

16. The method of claim 13, wherein the couple of opening sub-patterns are formed to be spaced apart from each other by a width of the pattern divider.

\* \* \* \* \*